United States Patent [19]

Nakao

[11] Patent Number: 5,319,230
[45] Date of Patent: * Jun. 7, 1994

[54] NON-VOLATILE STORAGE DEVICE
[75] Inventor: Hironobu Nakao, Kyoto, Japan
[73] Assignee: Rohm Co., Ltd., Kyoto, Japan
[*] Notice: The portion of the term of this patent subsequent to Feb. 16, 2010 has been disclaimed.
[21] Appl. No.: 885,549
[22] Filed: May 19, 1992
[30] Foreign Application Priority Data Sep. 11, 1991 [JP] Japan .................. 3-231877

[51] Int. Cl.⁵ .............................. H01L 29/78
[52] U.S. Cl. .................... 257/325; 257/411; 257/639
[58] Field of Search ........... 257/325, 411, 410, 639, 257/649

[56] References Cited

U.S. PATENT DOCUMENTS

| | | | |
|---|---|---|---|
| 3,765,935 | 10/1973 | Rand et al. | 257/411 |
| 3,805,130 | 4/1974 | Yamazaki | 257/325 |
| 4,621,277 | 11/1986 | Ito et al. | 257/411 |
| 4,868,632 | 9/1989 | Hayashi et al. | 257/411 |
| 5,034,798 | 7/1991 | Ohsima | 257/411 |
| 5,187,636 | 2/1993 | Nakao | 257/639 |

FOREIGN PATENT DOCUMENTS

| | | | |
|---|---|---|---|
| 58-17673 | 2/1983 | Japan | 257/411 |
| 61-97866 | 5/1986 | Japan | 257/411 |
| 2-265279 | 10/1990 | Japan | 257/411 |

Primary Examiner—Sara W. Crane
Assistant Examiner—Courtney A. Bowers
Attorney, Agent, or Firm—Oliff & Berridge

[57] ABSTRACT

A non-volatile storage device such as a PROM (Programmable Read Only Memory). To obtain an adequate sum of captured charges by a low storing voltage and to prevent charges from being injected from a gate electrode, a silicon oxide film, a composite silicon oxide/nitride film and a silicon oxide film are formed in order on a gate region of a silicon substrate on which a source region and a drain region are formed. Since the composite silicon oxide/nitride film has many interfaces between the silicon oxide region and the silicon nitride region, it accumulates a lot of charges from the silicon substrates.

3 Claims, 4 Drawing Sheets

NON-VOLATILE STORAGE DEVICE

BACKGROUND OF THE INVENTION

1. Field of the Invention

This invention relates to a non-volatile storage device, and more particularly to a non-volatile storage device which is reloadable by a low voltage.

Non-volatile memories are devices which are important in widening the application of general purpose LSIs; for example, they are used as PROMs (Programmable Read Only Memory).

FIGS. 5A and 5B of the accompanying drawings show a MNOS (Metal Nitride Oxide Semiconductor) memory as a typical non-volatile storage device. The MNOS memory comprises a silicon oxide film 12, a silicon nitride film 14 and an aluminum electrode 16, which are laminated in order on a silicon substrate 10 on which a drain region and a source region are formed. Although the silicon oxide film 12 causes a current normally not to flow, a current would flow due to a tunnel phenomenon if the silicon oxide film 12 is very thin and if a high voltage is applied to it. When this current is received by the silicon nitride film 14, charges would be captured from near the interface between the silicon nitride 14 and the silicon oxide film 12 toward the inside of the silicon nitride film 14. With the charges accumulated, a drain current does not flow unless a voltage sufficiently excessive to cancel the captured charges is applied, and the captured charges disappear even if no voltage is applied. Therefore the condition whether this drain current flows or does not flow corresponds to 1 bit of data.

Specifically, during storing data, as shown in FIG. 5A, a voltage higher than 5 V (usually about 25 V) is applied to the gate electrode to cause charges to be captured by the silicon nitride film 14, and during reading data, as shown in FIG. 5B, a voltage of 5 V is applied to the gate electrode and the drain electrode to detect whether or not a drain current flows.

With the conventional MNOS memory, although it is possible to electrically store and erase data, it requires a storing voltage of 25 V, which is relatively high.

To this end, a MONOS (Metal Oxide Nitride Oxide Semiconductor) memory which is an improvement of the MNOS memory and which requires only a storing voltage of less than 25 V has been proposed. As shown in FIG. 6, this MONOS memory comprises a silicon oxide film 12, a silicon nitride film 14, a silicon oxide film 15 and a polysilicon electrode 16, which are laminated in order on a silicon substrate 10 on which a drain region and a source region are formed. Thus with the silicon oxide film 15 between the silicon nitride film 14 and the polysilicon electrode 16, potential barriers will be formed at opposite side of the silicon nitride film 14 so that charges injected from the silicon substrate are captured with an improved efficiency. Since it is possible to eliminate the limit of reducing the thickness of the silicon nitride film 14, further reduction of the thickness of the silicon nitride film can be progressed to enable a low-voltage operation. Reducing the sum of captured charges by a very small thickness of the silicon nitride film cannot be neglected, and it is difficult to obtain an excellent characteristic due to non-stable operation even if the thickness of the silicon nitride film is optimum.

SUMMARY OF THE INVENTION

It is therefore an object of this invention to provide a non-volatile storage device which can obtain an adequate sum of captured charges and can be reloaded by a low voltage.

Another object of the invention is to provide a method of manufacturing the above-mentioned non-volatile storage device.

According to a first aspect of the invention, there is provided a non-volatile storage device comprising: a semiconductor substrate on which a source region and a drain region are formed; a first oxide film formed on a gate region between the source region and the drain region of the semiconductor substrate; a composite oxide/nitride film formed on the first oxide film and having an oxide region and a nitride region in a mixed state; and a second oxide film formed on the composite oxide/nitride film.

According to a second aspect of the invention, there is provided a method of manufacturing a non-volatile storage device, comprising the steps of: forming a first oxide film on a semiconductor substrate; forming an oxide film on the first oxide film by sputtering; etching the oxide film, which is formed in the sputtering step, by a predetermined quantity; nitriding the oxide film, which is etched in the etching step, by exposing it to a nitrogen atmosphere; forming a composite oxide/nitride film by repeating the sputtering step through the nitriding step; and forming a second oxide film on the composite oxide/nitride film.

With this non-volatile storage device, since the composite oxide/nitride film has many interfaces which captures charges, it is possible to increase the sum of captured charges even if the composite oxide/nitride film is reduced in thickness.

The second oxide film formed on the composite oxide/nitride film serves to prevent penetration of charges injected from the gate electrode, thus suppressing deterioration of the first oxide film of the semiconductor substrate resulting from the charges.

DETAILED DESCRIPTION

A non-volatile storage device according to a preferred embodiment of this invention will now be described with reference to the accompanying drawings.

Figure 1:
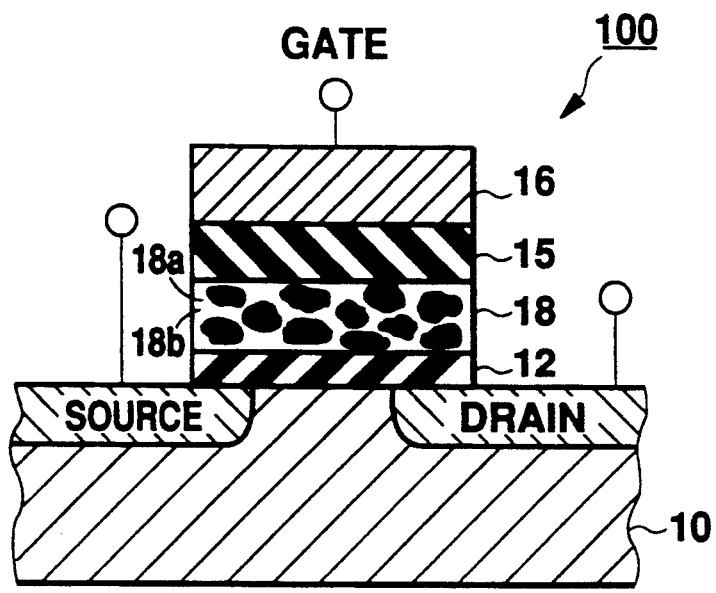
FIG. 1 is a cross-sectional view showing a non-volatile storage device according to one embodiment of this invention.

FIG. 1 shows the non-volatile storage device of this invention. The non-volatile storage device comprises a silicon oxide film 12, a composite silicon oxide/nitride film 18, a silicon oxide film 15 and a polysilicon electrode 16, which are formed in order on a gate of a silicon substrate 10 on which a source region and a drain region are formed, the gate being disposed between the source and drain regions. The composite silicon oxide/nitride film 18 includes a silicon oxide region 18a and a silicon nitride region 18b in a mixed state.

Figure 4:
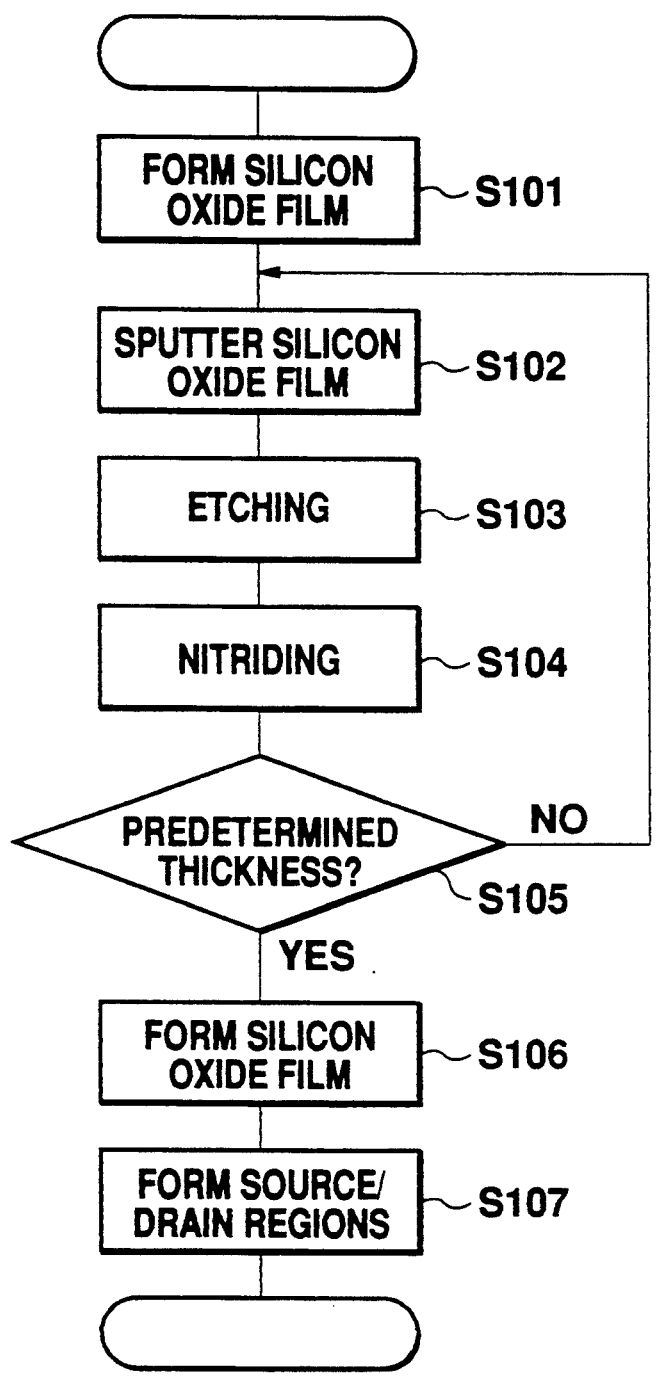
FIG. 4 is a flow diagram showing a method of manufacturing the non-volatile storage device of FIG. 1.
Figure 6:
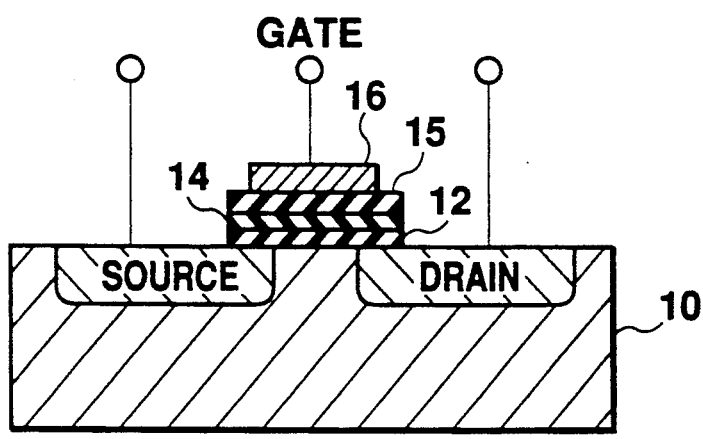
FIG. 6 is a cross-sectional view showing another conventional storage device.

FIG. 4 is a flow diagram showing a non-volatile storage device manufacturing method of this invention. In this method, firstly the silicon oxide film 12 is formed on the silicon substrate 10 by dry oxidation (S101). Then a silicon-rich silicon oxide film which contains excess silicon, compared to a stoichiometric composition, is formed by sputtering (S102). The silicon-oxide film is etched so that the surface of a silicon-precipitated region is exposed (S103). This silicon-precipitated region is exposed to a nitrogen and ammonia atmosphere to be nitrided (S104). The composite silicon oxide/nitride film 18 is formed by repeating the sputtering step (S102), the etching step (S103) and the nitriding step (S104) until the thickness of the composite silicon oxide/nitride film 18 reaches a predetermined value. Then the silicon oxide film 15 is formed on the composite silicon oxide/nitride film 18 by chemical vapour deposition (CVD) (S106). Finally, the source region and the drain region are formed on the silicon substrate 10 by ion implantation (S107), and the polysilicon electrode 16 is formed by sputtering. As a result, the non-volatile storage device is completed.

Figure 2:
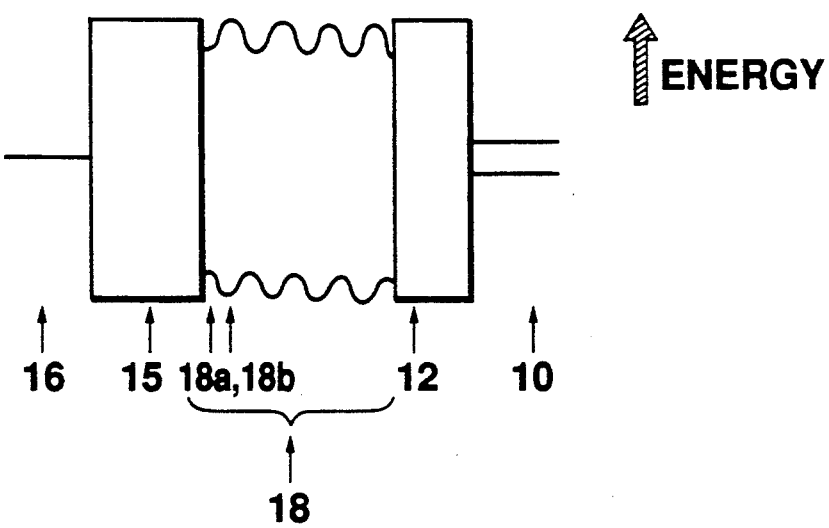
FIG. 2 is a diagram showing an energy band of the non-volatile storage device of FIG. 1.

FIG. 2 shows an energy band of the non-volatile storage device of this embodiment. In the composite silicon oxide/nitride film 18 having the silicon oxide and the silicon nitride region in a mixed state, the energy band has not a single value but a composite value consisting of a value of the silicon oxide region 18a and a value of the silicon nitride region 18b.

Therefore, if a positive voltage (e.g., 6 V) is applied to the gate electrode 16, electrons from the silicon substrate 10 are accumulated in high concentration in a potential well, which is defined by the level of interface between the silicon oxide region 18a and the silicon nitride region 18b and the level of interface between the silicon oxide film 12 and the silicon oxide region 18a, thus storing data.

In reading the stored data, like the conventional storage device, a predetermined positive voltage (e.g., 5 V) is applied to the gate electrode and the drain electrode, whereupon detection is made as to whether or not a drain current flows.

Figure 3:
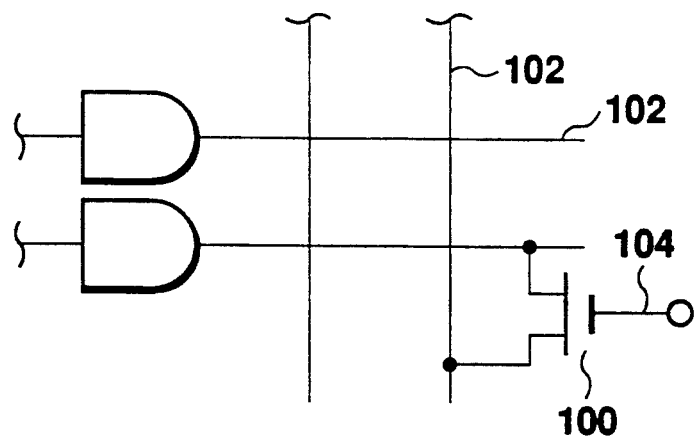
FIG. 3 is a diagram showing a circuit in which the non-volatile storage device of FIG. 1 is incorporated.
Figure 5A:
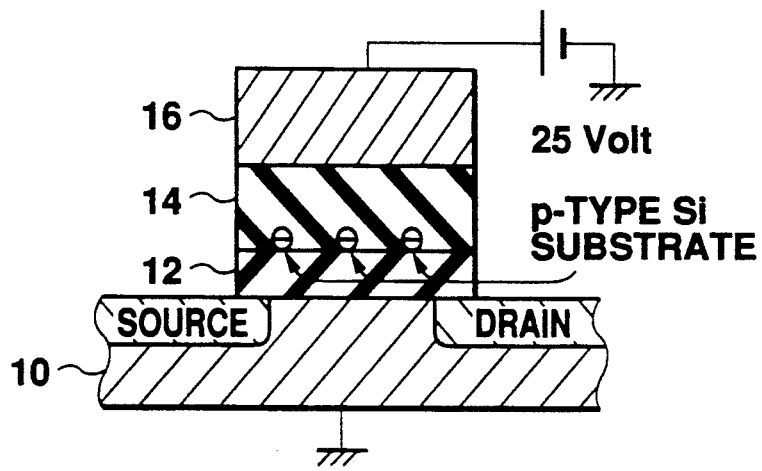
FIG. 5A is a cross-sectional view showing the storing operation of a conventional storage device.
Figure 5B:
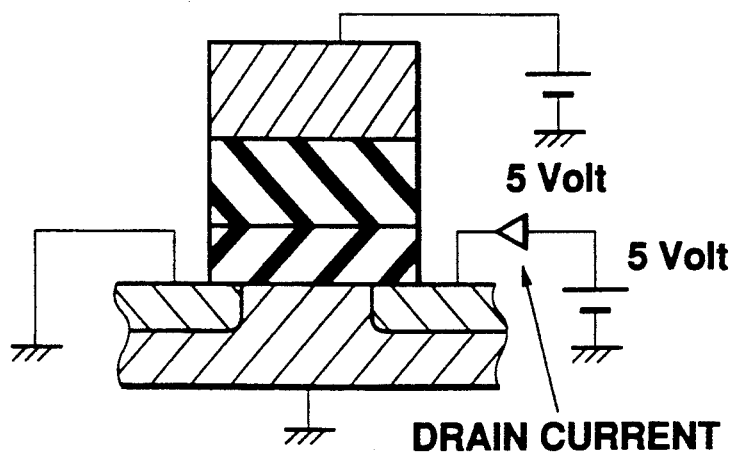
FIG. 5B is a cross-sectional view showing the reading operation of the conventional storage device.

FIG. 3 shows a circuit in which the non-volatile storage device 100 of this embodiment is incorporated. To the source and drain electrodes of the non-volatile storage device 100, bit lines 102 are connected, and to the gate electrode a work line 104 is connected. In the case where a plurality of the thus wired non-volatile storage devices 100 are provided, if one of these is to be selected, a desired word line 104 is selected and a positive voltage is applied to the gate electrode, thus storing data. If data is to be read, a predetermined positive voltage is applied via desired word and bit lines 104, 102, whereupon detection is made as to whether or not a drain current flows.

Thus this non-volatile storage device is a sandwich structure consisting of the silicon oxide film, a composite silicon oxide/nitride film and the silicon oxide film. The silicon-rich region of the composite silicon oxide/nitride film 18 is a conductor and is inadequate in insulation qualities; however, because of the silicon nitride region 18b, which is formed by nitriding excessive silicon, it is possible to obtain good insulation so that the silicon oxide film 12 under the composite silicon oxide/nitride film 18 can be reduced in thickness. Partly since the composite silicon oxide/nitride film 18 becomes high in dielectric constant, and partly since the partial pressure ratio (partial pressure ratio of the two-layer film when a constant voltage is applied to the gate) to the silicon oxide film 12 under the composite silicon oxide/nitride film 18 becomes increased, charges can be injected relatively easily. Further, since the silicon oxide film has a small charge mobility, the composite oxide/nitride film 18 having these two regions in a mixed state can be reduced in thickness, compared to the conventional single-layer silicon nitride film, thus realizing a low storing voltage.

When a positive voltage is applied to a gate, holes are injected from the polysilicon electrode 16; however, since the energy barrier of the silicon oxide is high, i.e. 8 eV, it is possible to prevent holes from being injected inwardly of the silicon oxide film 15, thus suppressing deterioration of the silicon oxide film 12 resulting from the injection of holes.

In the non-volatile storage device of this invention, partly since many of charges injected from the silicon substrate are captured by the very thin composite silicon oxide/nitride film, and partly since the silicon oxide film formed between the composite film and the electrode prevents charges from being injected from the electrode, a low storing voltage and also a stable operation can be realized.

What is claimed is:

1. A non-volatile storage device comprising:
   (a) a semiconductor substrate having a source region and a drain region;
   (b) a first oxide film formed on a gate region between said source region and said drain region of said semiconductor substrate;
   (c) a composite oxide/nitride film formed on said first oxide film and having a non-homogeneous mixture of oxide regions and nitride regions; and
   (d) a second oxide film formed on said composite oxide/nitride film.

2. A non-volatile storage device according to claim 1, wherein said oxide films are silicon oxide films, said oxide regions are silicon oxide regions and said nitride regions are silicon nitride regions.

3. A non-volatile storage device according to claim 1, wherein an electrode is formed on each of said source region, said drain region and said second oxide film.

* * * * *